(12) United States Patent
Ukechi et al.

(10) Patent No.: US 6,324,314 B1
(45) Date of Patent: Nov. 27, 2001

(54) OPTICAL HYBRID INTEGRATED DEVICE AND METHOD OF MAKING THE SAME

(75) Inventors: Mitsuo Ukechi; Takuya Miyashita, both of Tokyo (JP)

(73) Assignee: Japan Aviation Electronics Industry Limited, Tokyo (JP)

(*) Notice: Subject to any disclaimer, the term of this patent is extended or adjusted under 35 U.S.C. 154(b) by 0 days.

(21) Appl. No.: 09/401,327

(22) Filed: Sep. 23, 1999

(30) Foreign Application Priority Data

Sep. 25, 1998 (JP) .................................................. 10-271821

(51) Int. Cl.[7] ....................................................... G02B 6/12
(52) U.S. Cl. ...................................... 385/14; 385/2; 385/8
(58) Field of Search ............................. 385/2, 8, 14, 123, 385/129, 131, 132

(56) References Cited

U.S. PATENT DOCUMENTS 6,134,368 * 10/2000 Sakata .................................... 385/131

* cited by examiner

Primary Examiner—Hung Xuan Dang

(74) Attorney, Agent, or Firm—Connolly Bove Lodge & Hutz

(57) ABSTRACT

The surface area of a rectangular semiconductor substrate (10), which is used a reference plane, is composed of three regions arranged side by side in its lengthwise direction. A first one of the regions has a concavity (13) formed leaving opposite marginal portions of the region as banks (14a,14b), aid solder-coated pads (17) and alignment marks (18) are formed by metal thin films on the top surfaces of the banks. In a second region an electrode (16) is formed adjacent the first region and a semiconductor optical element (PD4) is mounted on the electrode with an active layer (31) of the former facing downward. An under-clad layer (211), acore (22), a height adjustment layer (26) and an over-clad layer (212), which constitute an optical waveguide, are formed over the surface of a second substrate, and the over-clad layer overlying both marginal portions of the second substrate is removed to expose the height adjustment layer to form terraces (20a, 20b) corresponding to the banks. Solder-coated pads (23) and alignment marks (24) are formed by metal films on the terraces, and the solder-coated pads (17) and (23) are soldered to each other with the banks and the terraces positioned using the alignment marks (18) and (24). The thickness of the height adjustment layer (26) is predetermined so that the core and the semiconductor active layer (31) lie at the same vertical position relative to the reference plane.

11 Claims, 7 Drawing Sheets

OPTICAL HYBRID INTEGRATED DEVICE AND METHOD OF MAKING THE SAME

BACKGROUND OF THE INVENTION

The present invention relates to an optical hybrid integrated device having such semiconductor optical elements as a laser diode and a photodiode and an optical waveguide mounted on its substrate and a method of making such an optical waveguide device.

The optical hybrid integrated device is a device of the type in which there are mounted on the same substrate desired elements such as a light emitting element, a photodetector, an optical modulator, an optical filter, a wavelength shifter, an optical waveguide and an optical coupler. Furthermore, one end portion of an optical fiber, for instance, is positioned in and fixed to a V-groove cut in a silicon substrate with the end face of the optical fiber facing toward one end face of the optical waveguide for connection with another optical device. For example, the active layer (a light emitting region) of the laser diode is several micrometers above its electrode; this vertical position is appreciably lower than that of a core of the optical waveguide to which the laser diode is to be optically connected. The core is usually about 10 μm thick and buried in an about 40-μm thick clad layer of the optical waveguide substantially centrally thereof. Accordingly, in the case where the clad layer with the core buried therein is formed on the silicon substrate and the laser diode with its active layer underside is disposed on the same substrate surface in opposing relation to the end face of the core, the vertical positions of the optical waveguide (core) and the active layer of the laser diode are greatly displaced from each other. An optical hybrid integrated device manufacturing method which solves this problem is described, for example, in Horiguchi, "Hybrid Optical Integration Techniques," Denshi Zairyou, pp.97–102, June, 1995.

With reference to FIGS. 1A through 1D, the proposed manufacturing process will be described below in brief. To begin with, a terrace 10A is formed by etching in the surface of a silicon substrate 10 and then an under-clad glass layer 2A of a quartz optical waveguide is formed over the entire area of the substrate surface as depicted in FIG. 1A. Then, the under-clad layer 2A is ground until the top of the terrace 10A is exposed, that is, the terrace 10A is surrounded by the under-clad layer 2A, after which a height adjustment layer 2B of the same material as that for the clad layer is formed all over the under-clad layer 2A including the terrace 10A as depicted in FIG. 1B. Then, a core 2C which serves as an optical waveguide is formed by patterning, and an over-clad layer is formed all over the substrate surface as shown in FIG. 1C. After this, the over-clad layer is selectively etched away to exposed the top surface of the terrace 10A as depicted in FIG. 1D. A semiconductor optical element 3, such as a laser diode or photodiode, is mounted on the terrace.

The thickness of the height adjustment layer 2B is predetermined so that the core 2C lies at the same vertical position as that of an active layer 3A of the optical element 3. According to this method, the vertical positioning of the active layer 3A of the semiconductor optical element 3 with respect to the optical waveguide (core) 2C need not be performed at the time of mounting the semiconductor optical element. Since an optical waveguide, an optical element, an optical fiber, and so forth are usually mounted on a single substrate, the fabrication procedure is complex and it is difficult to increase the packaging density.

A method which facilitates the manufacture of the optical hybrid integrated device and provides increased packaging density is proposed, for example, in Japanese Patent Application Laid-Open Gazette No. 10-133069, according to which a second substrate with an optical waveguide formed thereon is loaded on a first substrate with a semiconductor optical element mounted thereon, by positioning them using alignment marks formed thereon at corresponding positions. With this method, the depth of a V-groove for fixing therein an optical fiber can be predetermined so that the core of the optical fiber and the optical waveguide are at the same vertical position.

According to this method, for example, as depicted in FIG. 2A, there are formed alignment marks 18 and solder-coated electrodes 15A and 16A in the surface of arectangular silicon substrate 10 which has V-grooves 11A and 11B cut therein. Further, as shown in FIGS. 2B and 2C, there are provided on the surface of a second substrate 20 a clad layer 21 and a core 22 buried therein and forming optical waveguides 22a and 22b. On the surface of the second substrate 20 there are formed marks 24 corresponding to the alignment marks 18 on the first substrate 10. By accurately maintaining the positional relationships of the alignment marks 18 to the V-grooves 11A, 11B and the solder-coated electrodes 15A and 16A, the second substrate 20 is mounted on and soldered to the first substrate 10 with the clad layer 21 on the underside with the alignment marks held in position.

In this optical hybrid integrated device, the depths of the V-grooves 11A and 11B are predetermined taking account the thickness of a solder layer and the height from the clad surface of the optical waveguide to the core so that the vertical position of the core of the optical fiber is the same as that of the optical waveguide (core) relative to the top surface of the substrate 10. As regards the heights of the active layers of a light receiving element and a light emitting element which are fixed on the solder-coated electrodes 15A and 16A on the substrate 10, the thickness of an metal electrode on which a solder layer is formed is predetermined so that the vertical positions of the light receiving face and the light emitting face of the optical elements are the same as the vertical position of the optical waveguide (core). However, it is difficult that the solder-coated metal electrodes having thicknesses of several to tens of micrometers are formed with tolerances of 1 μm or better. This problem could be solved by a method in which four or two pedestals are formed to desired thicknesses on a substrate with tolerances of 1 μm or better in correspondence to four corners or both sides of the bottom the light receiving element or light emitting element except its central area, the light receiving element or light emitting element is mounted on the pedestals and an electrode on the substrate and the light receiving element or light emitting element is connected by a solder bumps midway between the four or two pedestals. However, this method has the defect of increasing manufacturing steps for forming the pedestals.

SUMMARY OF THE INVENTION

It is therefore an object of the present invention to provide an optical hybrid integrated device which is simple-structured and high in packaging density and a method of making such a device.

The optical hybrid integrated device according to the present invention has a first substrate with a semiconductor optical element mounted thereon and a second substrate with an optical waveguide formed thereon, and an under-clad layer and a core both forming the optical waveguide and a height adjustment layer covering the core are formed of the same material as that for the clad layer, and an overclad layer is formed over the height adjustment layer except its both marginal portions. By this, terraces are formed on both marginal portions of the second substrate. On the other hand, a concavity is formed in the surface of the first substrate except both marginal portions of the center region on which the second substrate is mounted, by which banks are formed on both marginal portions of the center region of the first substrate. The first substrate and the second substrate are joined together with the terraces of the latter resting on the banks of the former.

DETAILED DESCRIPTION OF THE PREFERRED EMBODIMENTS

A description will be given, with reference to FIGS. 3 and 4, of the optical hybrid integrated device according to an embodiment of the present invention.

Figure 1A:
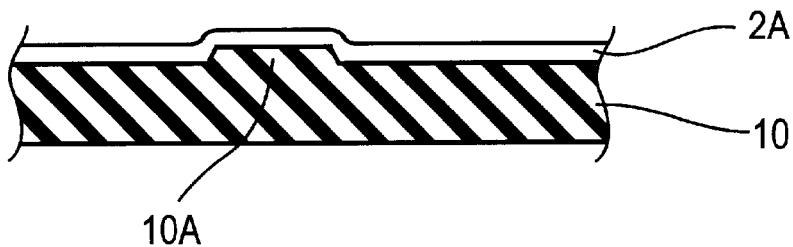
FIGS. 1A through 1D are diagrams depicting, in section, a sequence of steps involved in the manufacture of a first conventional optical hybrid integrated device.
Figure 1B:
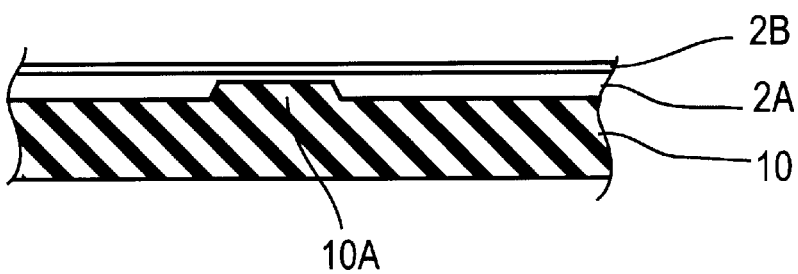
Figure 1C:
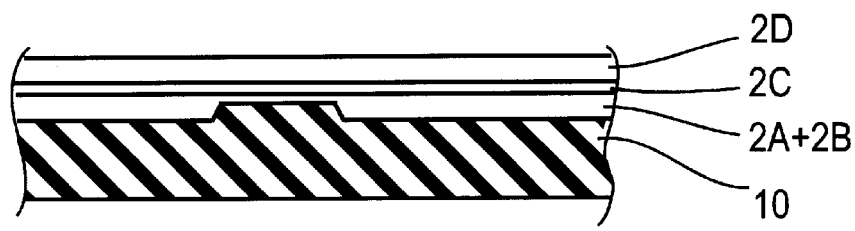
Figure 1D:
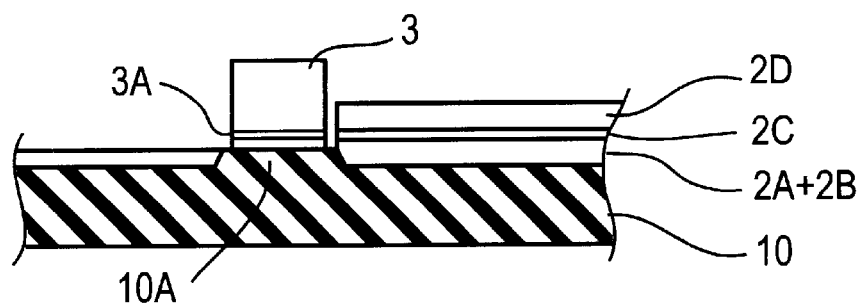
Figure 2A:
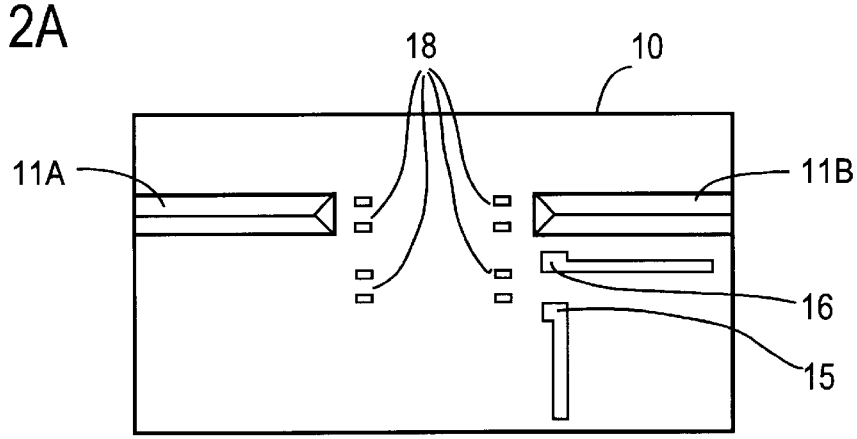
FIG. 2A is a plan view showing a mounting surface of a first substrate of a second conventional optical hybrid integrated device.
Figure 2B:
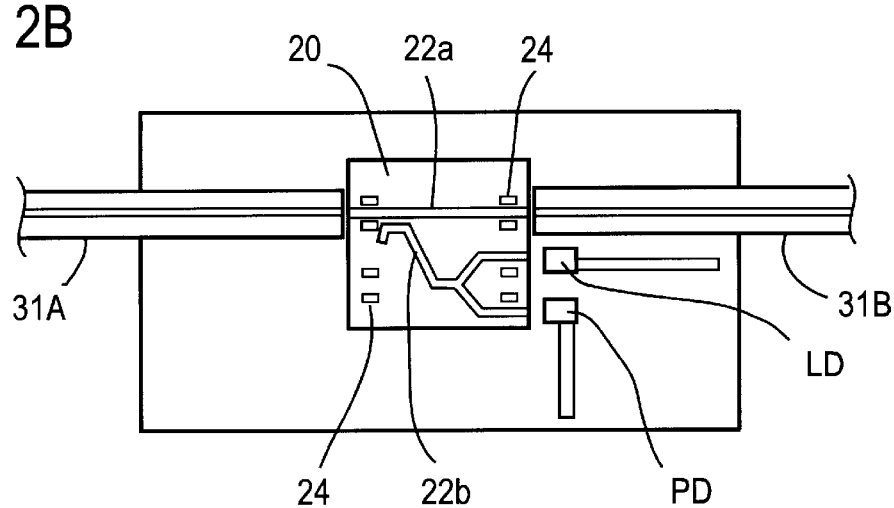
FIG. 2B is a plan view showing the second conventional optical hybrid integrated device with a second substrate having formed therein optical waveguides and mounted on the first substrate.
Figure 2C:
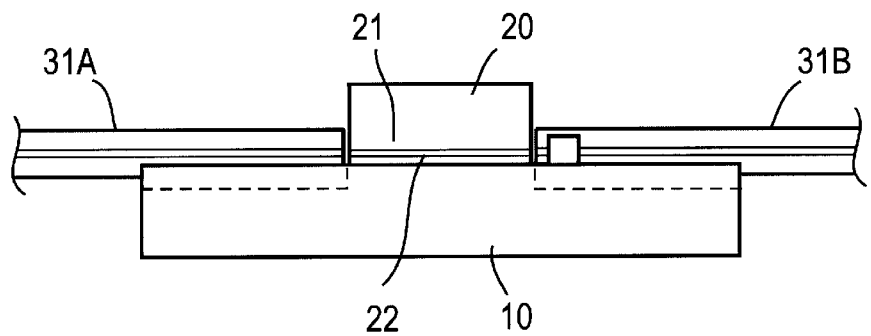
FIG. 2C is a side view of the second conventional optical hybrid integrated device depicted in FIG. 2B.
Figure 3:
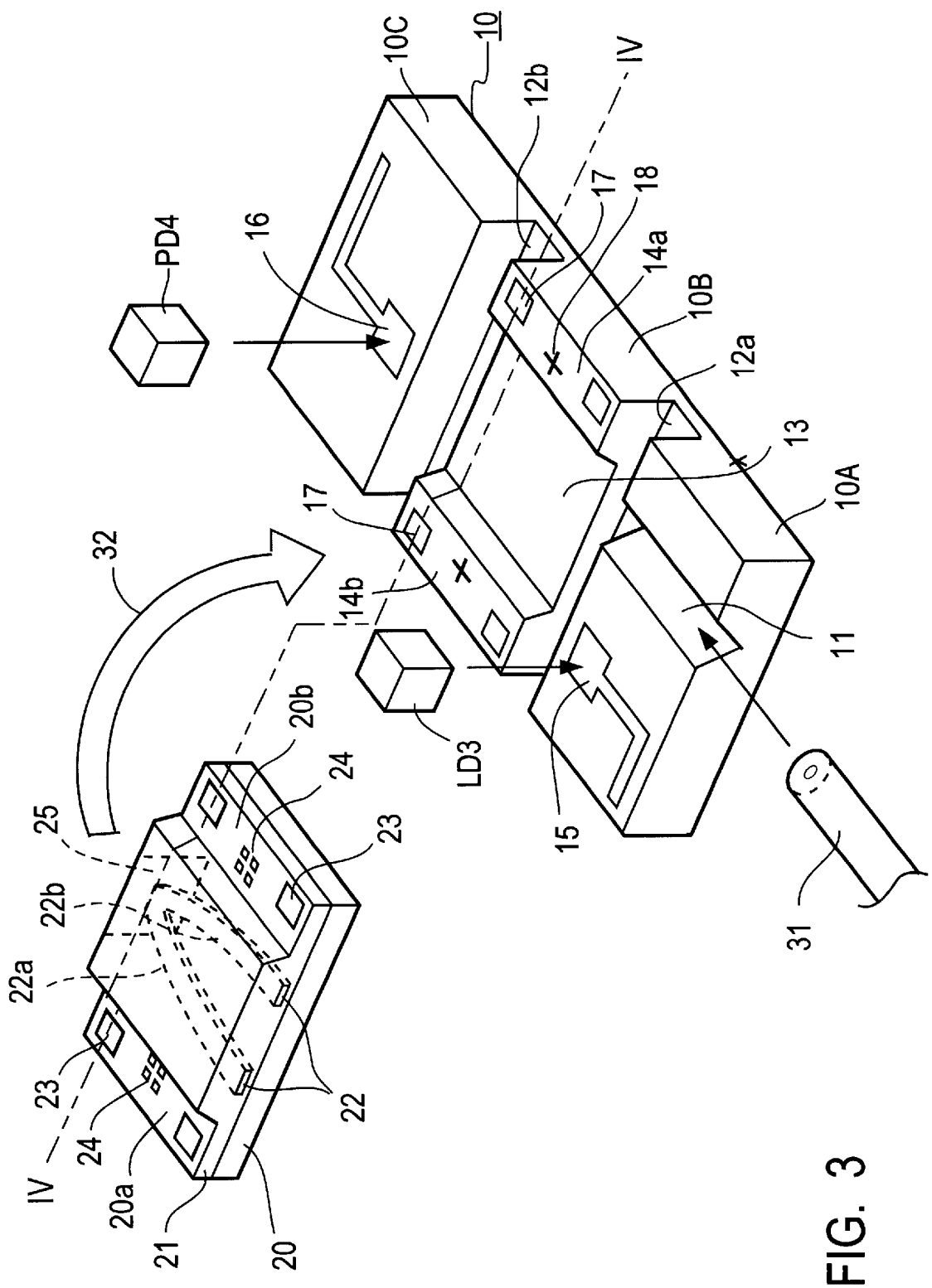
FIG. 3 is an exploded perspective view for explaining an embodiment of an optical hybrid integrated device according to the present invention.

FIG. 3 is an exploded perspective view of the optical hybrid integrated device according to the present invention. FIG. 4 is a diagram showing the vertical section along the line IV—IV in FIG. 3 as viewed from the direction indicated by the arrows; this diagram is explanatory of the relationship in vertical position between the core on the second substrate 20 and the light emitting part of the LD mounted on the first substrate 10.

In this embodiment the first substrate has mounted thereon a laser diode and a photodiode and the second substrate has formed thereon an optical waveguide of a V-letter shape as an optical coupling path. The second substrate is mounted on the first substrate with active layers of the laser diode and the photodiode held opposite terminations of the optical coupling path.

In the case of loading the second substrate 20 onto the first substrate 10 with a laser diode LD3 while turning the substrate 20 upside down in the direction of the arrow 32, it is necessary that the center position of the core 22 of the clad layer 21 formed on the second substrate 20 and the light emitting part (active layer) 31 of the laser diode LD3 mounted on the first substrate 10 be aligned with each other accurate within 1 μm with respect to a reference plane (the surface of the first substrate 10).

In a single mode optical waveguide whose clad and core have specific refractive indices of 0.3 to 0.4%, the core 22 measures approximately 7 by 7 μm and the clad layer 21 is about 40 μm thick. On the other hand, the light emitting part 31 of the laser diode LD3 is several micrometers high above the surface of the electrode 15. Hence, it is necessary that the center of the core 22 be held at a height of around 20-odd micrometers above the surface of the first substrate 10 (which is the reference surface).

Figure 4:
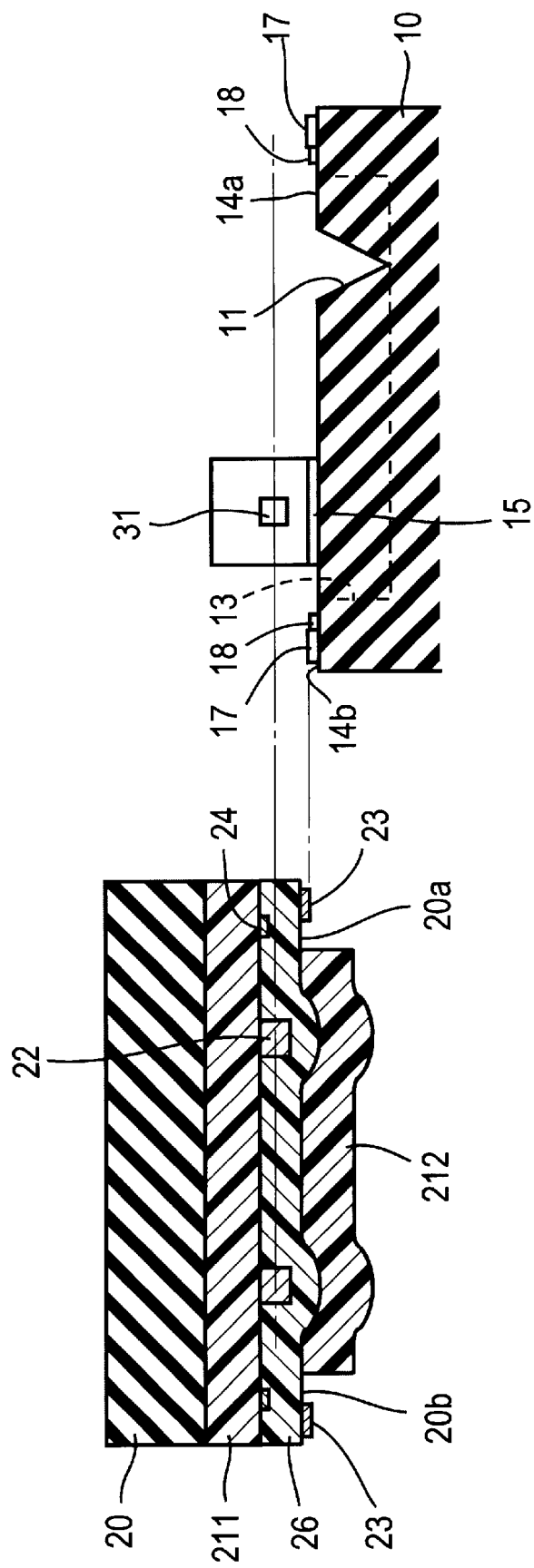
FIG. 4 is a sectional view depicting part of the device of the FIG. 3 embodiment.

In FIGS. 3 and 4, the surface of the first substrate 10 formed by a silicon single-crystal substrate is used as the reference surface, and its surface portion has three regions 10A, 10B and 10C partitioned by two grooves 12a and 12b extending across the substrate 10. In the surface of the left-hand one of the three regions, there is cut a V-groove 11 that extends in lengthwise of the substrate 10 from its one marginal edge to the groove 12a. In the surface of the region 10A there is formed the electrode 15 as well, to which the laser diode LD3 is soldered. In the surface of the intermediate region 10B, there is formed a wide concavity 13 that extends lengthwise of the substrate 10 from the one groove 12a to the other groove 12b, with banks 14a and 14b formed on both marginal portions of the substrate 10 in its lengthwise direction. In the surfaces of the banks 14a and 14b there are formed near opposite ends solder-coated pads 17 and alignment marks 18 intermediate therebetween. In the surface of the right-hand region 10C there is formed an electrode 16, to which a photodiode PD4 is soldered. In the V-groove 11 there is fixedly fitted an optical fiber 31 with its one end face held in the groove 12.

The electrodes 15, 16 and the solder-coated pads 17 are simultaneously formed by coating soldering metal as of gold/antimony (Au/Sb) to a thickness of approximately 2 to 3 μm all over a foundation metal film as of gold/chromium (Au/Cr) about 0.2 μm. On the other hand, the alignment marks 18 are also formed of the Au/Cr film simultaneously with the formation of the foundation metal film underlying the electrodes 15, 16 and the solder-coated pads 17.

The second substrate 20 formed by a silicon crystal substrate is covered over the entire area of its surface with a clad layer 21 of a polymer material. In the clad layer 21 there are buried the core 22 (22a, 22b) extending from one end to the other of the clad layer 21 to form an optical waveguide and alignment marks 24. And both marginal portions of the clad layer 21 form terraces 20a and 20b that have thicknesses about half that of the clad layer 21 itself. In the surfaces of the terraces 20a and 20b there are formed solder-coated pads 23 near four corners of the second substrate 20. More specifically, as depicted in FIG. 4, the clad layer 21 is composed of an under-clad layer 211 formed all over the surface of the second substrate 20, a height adjustment layer 26 formed all over the surface (underside in FIG. 4) of the under-clad layer 211 including the cores 22, and an over-clad layer 212 formed on the height adjustment layer 26. The core 22 and the alignment marks 24 are formed on the under-clad layer 211. The height adjustment layer 26 is exposed at both sides of the over-clad layer 212 to form the terraces 20a and 20b. When the second substrate 20 is placed onto the first substrate 10, the solder-coated pads 17 and 23 are joined together after being positioned relative to each other using the alignment marks 18 and 24, with the exposed surface areas of the height adjustment layer 26 held opposite the top surfaces of the banks 14a and 14b of the first substrate 10. Accordingly, the over-clad layer 212 protrusively provided on the second substrate 20 is snugly received in the concavity 13 of the first substrate 10. Since the relatively thin solder-coated pads 17 and 23 of several micrometers can be formed to fine tolerances of ±1 μm, their film thicknesses can be fixed to predetermined optimum values. The thickness of the height adjustment layer 26 can be determined, taking into account the thicknesses of the solder-coated pads 17 and 23, so that the vertical position of the core 22 relative to the reference plane is the same as the vertical position of the light emitting part (active layer) 31 of the laser diode LD3.

The core 22 has a V-letter shape with straight-line core segments joined together at one end. The free ends of the both segments are flush with the one end face of the second substrate 20, whereas the joined end of the V-shaped core 22 is flush with the other end face of the second substrate 20 that is opposite to the abovementioned one end face thereof. The left- and right-hand end faces of the clad layer 21 are flush with the left- and right-hand end faces of the second substrate 20. A dielectric multilayer-film filter 25 is bonded to the joined end face of the core 22.

The second substrate 20 is turned upside down in the direction of the arrow 32 and the terraces 20a and 20b are fixedly joined to the opposite banks 14a and 14b of the first substrate 10, by soldering the solder-coated pads 17 formed on the banks 14a and 14b and the solder-coated pads 23 on the terraces 20a and 20b. This joining work takes place referring to the alignment marks formed on the banks 14a and 14b and the alignment marks 24 on the terraces 20a and 20b. In this way, the optical hybrid integrated device is fabricated.

An optical signal of a first wavelength emitted from the laser diode LD3 is transmitted through the one core 22b and is reflected by the dielectric multilayer-film filter 25. The reflected optical signal is transmitted through the other core 22a and sent to the outside via the optical fiber 31 fixedly fitted in the V-groove 11. In contrast thereto, an external optical signal of a second wavelength transmitted over the optical fiber 31 propagates through the core 22a, then passes through the dielectric multilayer-film filter 25, and is received by the photodiode PD4.

Figure 5A:
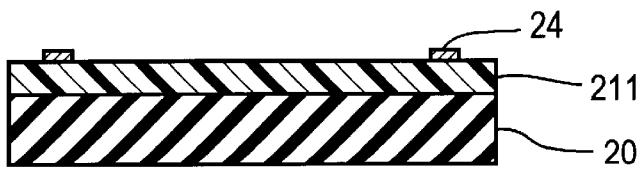
FIGS. 5A through 5G are diagrams illustrating, in section, a sequence of steps involved in the manufacture of the optical hybrid integrated device according to a first method of the present invention.

Now, a description will be given, with reference to FIGS. 5A through 5G, of steps involved in the formation of the optical waveguide in the second substrate 20. Referring first to FIG. 5A, the under-clad layer 211 is formed all over the surface of the second substrate 20. This is followed by depositing metal thin films as of gold/chromium (Au/Cr) on the surface of the under-clad layer 211 to form the alignment marks 24.

Figure 5B:
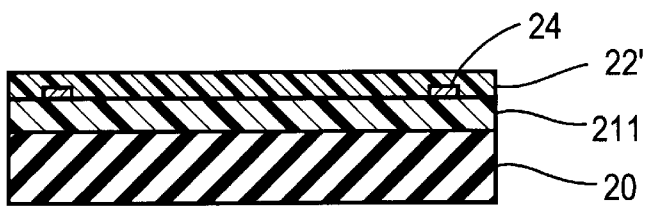

Next, as depicted in FIG. 5B, a core layer 22' is formed all over the surface of the under-clad layer 211 including the alignment marks 24.

Figure 5C:
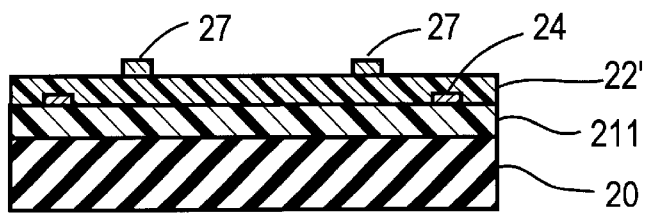

Next, as depicted in FIG. 5C, masks 27 are formed, relative to the alignment marks 24, on the surface of the core layer 22' in correspondence to the regions where to form the core 22. The masks 27 may be formed of, for example, an organic resist.

Figure 5D:
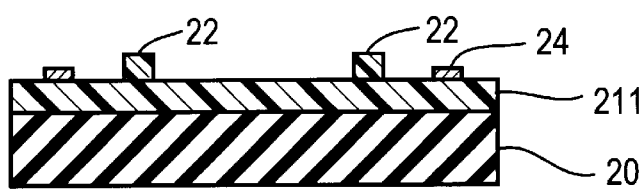

Next, as shown in FIG. 5D, the core layer 22' is selectively etched away, leaving the cores 22a and 22b and exposing the surface of the under-clad layer 211. By this, the cores 22a and 22b are patterned.

Figure 5E:
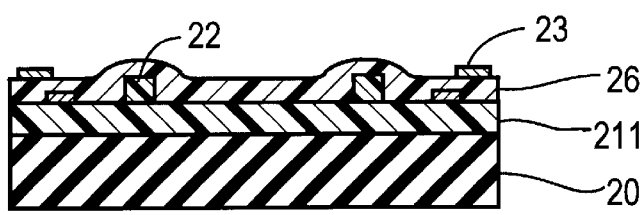

Next, as depicted in FIG. 5E, the height adjustment layer 26 of the same material as that of the under-clad layer 211 is formed over the entire surface area of the layer 211 including the cores 22a and 22b. Following this, a metal thin film as of gold/chromium (Au/Cr) is deposited all over the surface area of the height adjustment layer 26, and a soldering metal film as of gold/antimony (Au/Sb) is coated over the metal thin film to form the solder-coated pads 23.

Figure 5F:
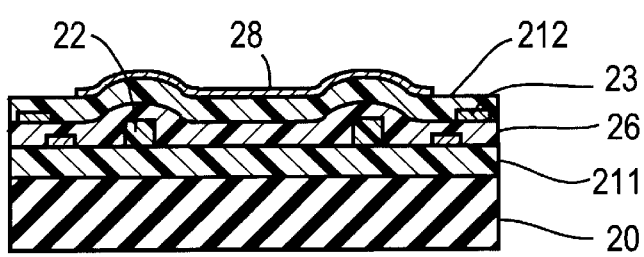

Next, as depicted in FIG. 5F, the over-clad layer 212 is formed over the entire surface area of the height adjustment layer 26 including the solder-coated pads 23, followed by forming a mask 28 on the over-clad layer 212 except its surface areas overlying the solder-coated pads 23. The mask 28 can be deposited using, for example, an organic resist.

Figure 5G:
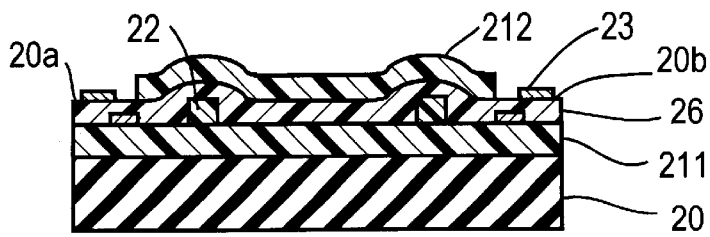

Finally, as depicted in FIG. 5G, the over-clad layer 212 is selectively etched away to expose the solder-coated pads 23 and form the terraces 20a and 20b. Since the solder-coated pads 23 formed by the aforementioned metal thin films are etchant-resistant, their vertical positions will not be affected even by excessive etching of the over-clad layer 212.

Turning next to FIGS. 6A through 6E, a description will be given of another embodiment of the method for forming the optical waveguide on the second substrate 20.

Figure 6A:
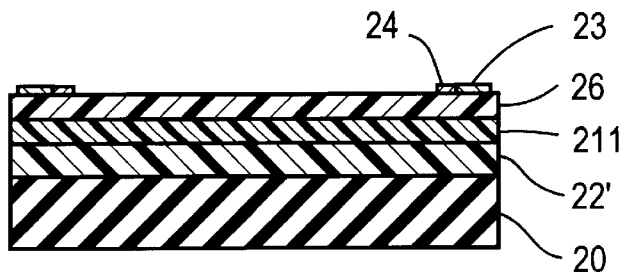
FIGS. 6A through 6E are diagrams illustrating a sequence of steps involved in the manufacture of the optical hybrid integrated device according to a second method of the present invention.

The first step is to form the under-clad layer 211 over the entire surface area of the second substrate 20, followed by the formation of the core layer 22' all over the surface of the under-clad layer 211 as depicted in FIG. 6A. Then, the height adjustment layer 26 of the clad material is formed all over the surface of the core layer 22'. And the solder-coated pads 23 and the alignment marks 24 are formed on the surface of the height adjustment layer 26 at predetermined positions.

Figure 6B:
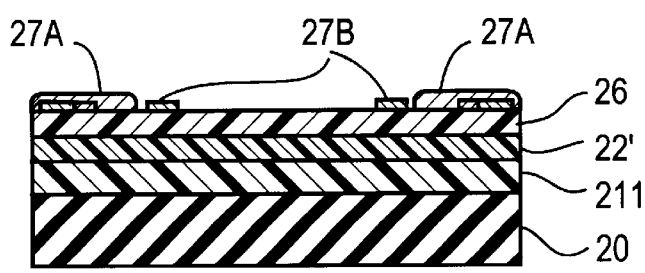

Next, as shown in FIG. 6B, masks 27A are formed covering the solder-coated pads 23 and the alignment marks 24, after which the a mask pattern 27B corresponding to the pattern of the core 22 to be formed is formed on the surface of the height adjustment layer 26 relative to the alignment marks 24.

Figure 6C:
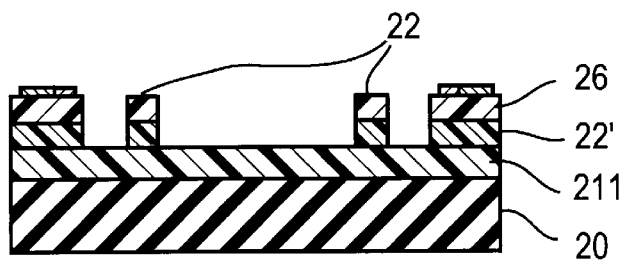

Next, as depicted in FIG. 6C, the height adjustment layer 26 is etched away downward until the surface of the under-clad layer 211 is exposed, by which the core 22 is patterned together with the height adjustment layer 26. Then, the masks 27A and 27B are removed.

Figure 6D:
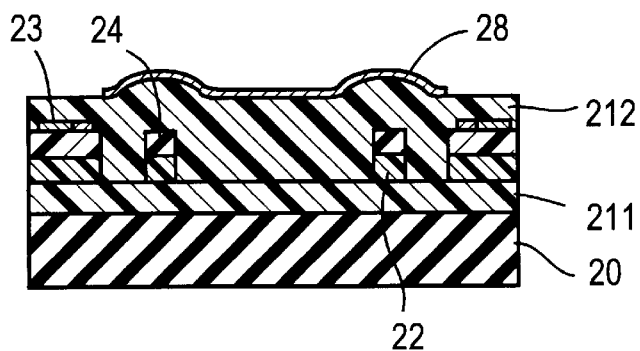

Next, as depicted in FIG. 6D, the over-clad layer 212 is formed over the entire surface area of the under-clad layer 211 including the solder-coated pads 23, the alignment marks 24 and the core 22 formed thereon. Then, the mask 28 is formed on the surface area of the over-clad layer 212 including the core 22 except the solder-coated pads 23 and the alignment marks 24.

Figure 6E:
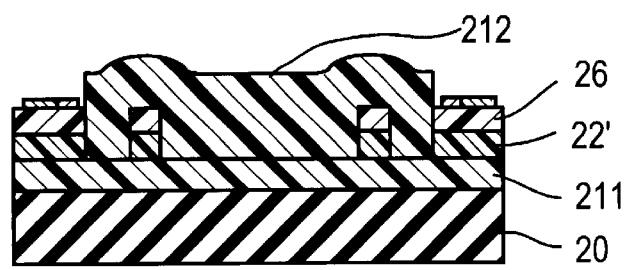

Next, as depicted in FIG. 6E, the over-clad layer 212 is selectively etched away to expose the solder-coated pads 23. Since the solder-coated pads 23 each formed by the aforementioned metal film is etchant-resistant, their vertical positions will not be affected even by excessive etching of the over-clad layer 212.

In the second manufacturing process described just above, the formation of the height adjustment layer 26 all over the surface of the core layer 22' is followed by patterning of the core 22. Accordingly, since the thickness of the core layer 22' acts as part of the height adjustment layer 26, the latter can be made thinner than in the case of the first-described manufacturing process.

Figure 7:
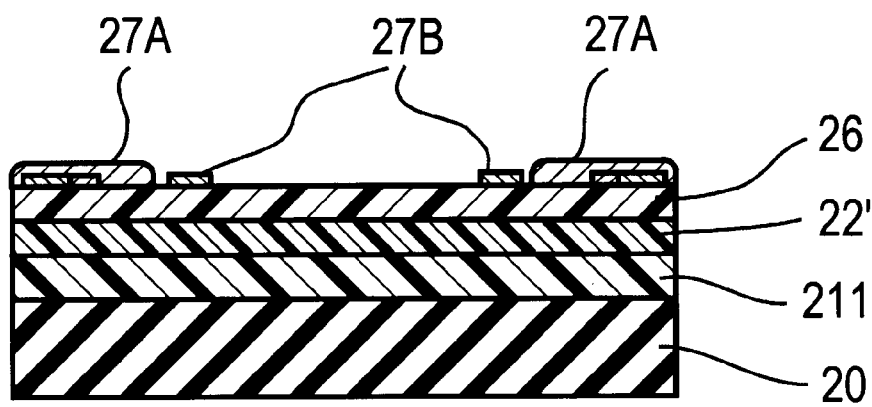
FIG. 7 is a diagram depicting a modification of the manufacturing step of FIG. 6A.

As illustrated in FIG. 7, the mask 27B for patterning the core 22 may also be formed at the same time as the metal thin film is formed and then patterned into the respective solder-coated pad in the step of FIG. 6A. That is, when the mask 27B for patterning the core 22 is formed by the metal thin film simultaneously with the formation of the solder-coated pads 23 and the alignment marks 24, patterns of the core 22, the solder-coated pads 23 and the alignment marks 24 can be formed by one photomask—this allows ease in achieving highly accurate positional relationships between them. For example, an organic resist can be used for the mask 27A.

In the manufacturing steps described above, since the core and the clad layer are formed of such a polymer as fluorine polyimide under temperature conditions of approximately 400° C., the metal thin films will not be affected. By forming the metal thin films through spin coating, they can be formed to a thickness of 1 $\mu$m or less with high accuracy.

In the second substrate 20 of the above construction the core 22 and the solder-coated pads 23 can be accurately positioned both in the horizontal and vertical directions. Hence, the second substrate 20 can be loaded on the first substrate 10 accurately at predetermined position based on the alignment marks 24, and the core 22 and the laser diode LD3 can be positioned relative to each other with high precision.

Effect of the Invention

As described above, according to the present invention, the height adjustment layer of the cladding material is formed over the core of the optical waveguide and the over-clad layer of an optically required thickness is formed over the surface of the height adjustment layer; hence, the vertical position of the core can easily be adjusted, and the height adjustment layer and the over-clad layer can be formed to optimum thicknesses independently of each other.

And, the solder-coated pads are formed by the metal thin films and are not etched during the formation of the core pattern by selectively etching away the core layer of a polymer. Accordingly, even if the core layer is a little over-etched, the vertical positions of the solder-coated pads are not affected.

Furthermore, at the time of forming and patterning the metal thin film into the solder-coated pads, the mask for the core can also be formed by the metal thin film simultaneously with the formation of the solder-coated pads and the alignment marks; hence, their positional relationships can be implemented with high precision.

Moreover, since the core and the clad layer are formed using such a polymer as fluorine polyimide under temperature conditions of approximately 400° C. in the manufacture of the optical hybrid integrated device, the metal thin films will not be affected. By forming the metal thin films are formed through spin coating, their thickness accuracy of better than 1 $\mu$m can be achieved with ease.

Since the core and the solder-coated pads of the second substrate can be accurately positioned both in the horizontal and vertical directions, the second substrate can be loaded on the first substrate accurately at predetermined position based on the alignment marks, and the core and the optical element can be positioned relative to each other with high precision.

It will be apparent that many modifications and variations may be effected without departing from the scope of the novel concepts of the present invention.

What is claimed is:

1. An optical hybrid integrated device comprising:
   a substantially rectangular first substrate having a surface that defines a reference plane,
      said first substrate having at least first and second regions adjacent to each other in its lengthwise direction,
      said second region having at least one electrode formed adjacent said first region and at least one semiconductor optical element mounted on said at least one electrode and having an active layer facing toward said at least one electrode, and
      said first region having banks which extend along its opposite marginal edges and define a concavity therebetween; and
   a second substrate of a size large enough to substantially cover said first region of said first substrate,
      said second substrate having a clad layer composed of an under-clad layer, a height adjustment layer and an over-clad layer formed of the same clad material in layers on the surface of said second substrate and covering said second substrate from its one end to the other, and
      a core formed between said under-clad layer and said height adjustment layer to constitute an optical waveguide of a desired pattern extending from one end to the other of said second substrate, said core being formed of a core material lower in refractive index than said clad material; and wherein:
         said over-clad layer on both marginal portions of said second substrate corresponding to said banks is removed to expose the surfaces of said height adjustment layer, said exposed surfaces forming terraces on the both marginal portions of said second substrate; and
         said second substrate is mounted on said first substrate with top surfaces of said terraces held in contact with top surfaces of said banks.

2. The device of claim 1, wherein said banks have first solder-coated pads formed by metal films on the top surfaces thereof and said terraces have second solder-coated pads formed by metal films on the top surfaces thereof at positions corresponding to said first solder-coated pads, said first and second solder-coated pads being soldered to each other.

3. The device of claim 1 or 2, wherein said banks have first alignment marks formed by metal films on the top surfaces thereof and said terraces have second alignment marks formed by metal films on the top surfaces of said under-clad layer on said banks in correspondence to said first alignment marks.

4. The device of claim 1 or 2, wherein said banks have first alignment marks formed by metal films on top surfaces thereof and said terraces have second alignment marks on top surfaces of said height adjustment layer on said terraces in correspondence to said first alignment marks.

5. The device of claim 1 or 2, wherein said first substrate is a semiconductor substrate.

6. The device of claim 1 or 2, wherein said first substrate has a third region adjacent said first region at the side opposite to said second region, said third region having cut therein a V-groove extending from one end of said third region to a boundary between it and said first region for fixedly positioning an optical fiber.

7. The device of claim 1 or 2, wherein said core and said clad layer are formed of a polymer material.

8. A method of making an optical hybrid integrated device in which a first substrate, which has in its surface a first region with a centrally-disposed concavity defined by banks along its opposite marginal portions and a second region adjacent said concavity of said first region and having disposed thereon an electrode and a semiconductor optical element mounted on said electrode, is loaded with a second substrate with an optical waveguide formed thereon, and solder-coated pads formed on said banks and solder-coated pads formed on terraces of said second substrate corresponding to said banks of said first substrate are soldered to each other by positioning them through the use of alignment marks formed on said banks and alignment marks on said terraces, said method comprising the steps of:

(a) forming an under-clad layer all over the surface of said second substrate where to form a core constituting an optical waveguide;

(b) forming said alignment marks on the surface of said under-clad layer;

(c) forming a core layer and patterning it into said core through the use of said alignment marks as reference positions in the horizontal direction;

(d) forming a height adjustment layer of the same material as a clad material all over the surface of said under-clad layer including said core;

(e) forming a metal thin film on said height adjustment layer to form said solder-coated pads;

(f) forming an over-clad layer all over the surface of said height adjustment layer; and (g) selectively etching away said over-clad layer to expose said solder-coated pads.

9. A method of making an optical hybrid integrated device in which a first substrate, which has in its surface a first region with a centrally-disposed concavity defined by banks along its opposite marginal portions and a second region adjacent said concavity of said first region and having disposed thereon an electrode and a semiconductor optical element mounted on said electrode, is loaded with a second substrate with an optical waveguide formed thereon, and solder-coated pads formed on said banks and solder-coated pads formed on terraces of said second substrate corresponding to said banks of said first substrate are soldered to each other by positioning them through the use of alignment marks formed on said banks and alignment marks on said terraces, said method comprising the steps of:

(a) forming an under-clad layer, a core layer and a height adjustment layer of said same material as a clad material in this order all over the surface of said second substrate where to form a core constituting an optical waveguide;

(b) forming a metal thin film all over the surface of said height adjustment layer to form said solder-coated pads and said alignment marks;

(c) patterning said core layer into said core, together with said height adjustment layer overlying it through the use of said alignment marks as reference positions in the horizontal direction and forming an over-clad layer over the surface of said under-clad layer including said core; and (d) selectively etching away said over-clad layer to expose said solder-coated pads.

10. The method of claim 9, wherein a mask for patterning said core is formed simultaneously with the patterning of said solder-coated pads.

11. The method of claim 8, 9, or 10, wherein polymer is used as a material for forming said core and said clad layer and their formation is performed by spin coating.

* * * * *